United States Patent
Abdul Rashid et al.

(10) Patent No.: US 9,227,324 B1
(45) Date of Patent: Jan. 5, 2016

(54) MANDREL FOR SUBSTRATE TRANSPORT SYSTEM WITH NOTCH

(71) Applicant: WD Media, LLC, San Jose, CA (US)

(72) Inventors: Ahmad Faisul B. HJ. Abdul Rashid, Bayan Lepas (MY); Landdell Gregory, Georgetown (MY)

(73) Assignee: WD Media, LLC, San Jose, CA (US)

( * ) Notice: Subject to any disclaimer, the term of this patent is extended or adjusted under 35 U.S.C. 154(b) by 0 days.

(21) Appl. No.: 14/497,213

(22) Filed: Sep. 25, 2014

(51) Int. Cl.
*B25J 15/00* (2006.01)
*B25J 11/00* (2006.01)
*H01L 21/673* (2006.01)
*H01L 21/677* (2006.01)

(52) U.S. Cl.
CPC .............. *B25J 15/0047* (2013.01); *B25J 11/00* (2013.01); *H01L 21/67313* (2013.01); *H01L 21/67757* (2013.01)

(58) Field of Classification Search
CPC ........... B25J 15/0047; H01L 21/67313; H01L 21/67757
See application file for complete search history.

(56) References Cited

U.S. PATENT DOCUMENTS

| | | | |
|---|---|---|---|
| 4,290,734 A | 9/1981 | Van Breen | |
| 4,518,349 A | 5/1985 | Tressler et al. | |
| 4,645,401 A * | 2/1987 | Hopkins | G11B 23/0021 414/222.12 |
| 4,735,540 A | 4/1988 | Allen et al. | |
| 4,779,724 A * | 10/1988 | Benz | G11B 33/0433 206/303 |
| 4,865,509 A * | 9/1989 | Carlton | B65G 47/90 414/908 |
| 4,957,406 A * | 9/1990 | Akagawa | H01L 21/67781 414/908 |
| 4,958,873 A * | 9/1990 | Akagawa | H01L 21/68707 294/158 |
| 5,259,719 A * | 11/1993 | Akagawa | H01L 21/67781 414/908 |
| 5,423,653 A | 6/1995 | Harper | |
| 5,987,735 A | 11/1999 | Horning et al. | |
| 6,013,161 A | 1/2000 | Chen et al. | |
| 6,063,248 A | 5/2000 | Bourez et al. | |
| 6,068,891 A | 5/2000 | O'Dell et al. | |
| 6,086,730 A | 7/2000 | Liu et al. | |
| 6,099,981 A | 8/2000 | Nishimori | |
| 6,103,404 A | 8/2000 | Ross et al. | |
| 6,117,499 A | 9/2000 | Wong et al. | |
| 6,136,403 A | 10/2000 | Prabhakara et al. | |
| 6,143,375 A | 11/2000 | Ross et al. | |
| 6,145,849 A | 11/2000 | Bae et al. | |
| 6,146,737 A | 11/2000 | Malhotra et al. | |
| 6,149,696 A | 11/2000 | Jia | |
| 6,150,015 A | 11/2000 | Bertero et al. | |
| 6,156,404 A | 12/2000 | Ross et al. | |
| 6,159,076 A | 12/2000 | Sun et al. | |
| 6,164,118 A | 12/2000 | Suzuki et al. | |
| 6,200,441 B1 | 3/2001 | Gornicki et al. | |
| 6,204,995 B1 | 3/2001 | Hokkyo et al. | |
| 6,206,765 B1 | 3/2001 | Sanders et al. | |
| 6,210,819 B1 | 4/2001 | Lal et al. | |

(Continued)

FOREIGN PATENT DOCUMENTS

| | | |
|---|---|---|
| JP | 05-28471 A * | 2/1993 |
| JP | 06-150307 A * | 5/1994 |

*Primary Examiner* — Gerald McClain

(57) ABSTRACT

A mandrel for transporting a set of substrates includes a rod having a free end and a fixed end, the fixed end configured to be coupled to a transport mechanism. A series of spacer elements are arranged on the rod to keep the set of substrates seated on the rod in respective fixed positions with a last spacer element nearest to the fixed end. A notch is arranged on the rod between the fixed end and the last spacer element configured to catch a substrate that becomes unseated from the last spacer element.

16 Claims, 7 Drawing Sheets

(56) References Cited

U.S. PATENT DOCUMENTS

| | | |
|---|---|---|
| 6,216,709 B1 | 4/2001 | Fung et al. |
| 6,221,119 B1 | 4/2001 | Homola |
| 6,248,395 B1 | 6/2001 | Homola et al. |
| 6,261,681 B1 | 7/2001 | Suekane et al. |
| 6,270,885 B1 | 8/2001 | Hokkyo et al. |
| 6,274,063 B1 | 8/2001 | Li et al. |
| 6,283,838 B1 | 9/2001 | Blake et al. |
| 6,287,429 B1 | 9/2001 | Moroishi et al. |
| 6,290,573 B1 | 9/2001 | Suzuki |
| 6,299,947 B1 | 10/2001 | Suzuki et al. |
| 6,303,217 B1 | 10/2001 | Malhotra et al. |
| 6,309,765 B1 | 10/2001 | Suekane et al. |
| 6,337,842 B1 | 1/2002 | Wolfer et al. |
| 6,340,090 B1 * | 1/2002 | Jahani .............. H01L 21/67313 118/500 |
| 6,358,636 B1 | 3/2002 | Yang et al. |
| 6,362,452 B1 | 3/2002 | Suzuki et al. |
| 6,363,599 B1 | 4/2002 | Bajorek |
| 6,365,012 B1 | 4/2002 | Sato et al. |
| 6,381,090 B1 | 4/2002 | Suzuki et al. |
| 6,381,092 B1 | 4/2002 | Suzuki |
| 6,387,483 B1 | 5/2002 | Hokkyo et al. |
| 6,391,213 B1 | 5/2002 | Homola |
| 6,395,349 B1 | 5/2002 | Salamon |
| 6,403,919 B1 | 6/2002 | Salamon |
| 6,408,677 B1 | 6/2002 | Suzuki |
| 6,426,157 B1 | 7/2002 | Hokkyo et al. |
| 6,429,984 B1 | 8/2002 | Alex |
| 6,482,330 B1 | 11/2002 | Bajorek |
| 6,482,505 B1 | 11/2002 | Bertero et al. |
| 6,500,567 B1 | 12/2002 | Bertero et al. |
| 6,528,124 B1 | 3/2003 | Nguyen |
| 6,548,821 B1 | 4/2003 | Treves et al. |
| 6,552,871 B2 | 4/2003 | Suzuki et al. |
| 6,565,719 B1 | 5/2003 | Lairson et al. |
| 6,566,674 B1 | 5/2003 | Treves et al. |
| 6,571,806 B2 | 6/2003 | Rosano et al. |
| 6,596,083 B2 | 7/2003 | Cromwell et al. |
| 6,628,466 B2 | 9/2003 | Alex |
| 6,664,503 B1 | 12/2003 | Hsieh et al. |
| 6,670,055 B2 | 12/2003 | Tomiyasu et al. |
| 6,682,807 B2 | 1/2004 | Lairson et al. |
| 6,683,754 B2 | 1/2004 | Suzuki et al. |
| 6,730,420 B1 | 5/2004 | Bertero et al. |
| 6,743,528 B2 | 6/2004 | Suekane et al. |
| 6,759,138 B2 | 7/2004 | Tomiyasu et al. |
| 6,778,353 B1 | 8/2004 | Harper |
| 6,795,274 B1 | 9/2004 | Hsieh et al. |
| 6,855,232 B2 | 2/2005 | Jairson et al. |
| 6,857,937 B2 | 2/2005 | Bajorek |
| 6,893,748 B2 | 5/2005 | Bertero et al. |
| 6,899,959 B2 | 5/2005 | Bertero et al. |
| 6,916,558 B2 | 7/2005 | Umezawa et al. |
| 6,939,120 B1 | 9/2005 | Harper |
| 6,946,191 B2 | 9/2005 | Morikawa et al. |
| 6,967,798 B2 | 11/2005 | Homola et al. |
| 6,972,135 B2 | 12/2005 | Homola |
| 6,996,034 B1 | 2/2006 | Taniguchi et al. |
| 7,004,827 B1 | 2/2006 | Suzuki et al. |
| 7,006,323 B1 | 2/2006 | Suzuki |
| 7,016,154 B2 | 3/2006 | Nishihira |
| 7,019,924 B2 | 3/2006 | McNeil et al. |
| 7,032,232 B2 | 4/2006 | Russ |
| 7,045,215 B2 | 5/2006 | Shimokawa |
| 7,070,870 B2 | 7/2006 | Bertero et al. |
| 7,090,934 B2 | 8/2006 | Hokkyo et al. |
| 7,099,112 B1 | 8/2006 | Harper |
| 7,105,241 B2 | 9/2006 | Shimokawa et al. |
| 7,119,990 B2 | 10/2006 | Bajorek et al. |
| 7,147,790 B2 | 12/2006 | Wachenschwanz et al. |
| 7,150,790 B2 | 12/2006 | Russ |
| 7,161,753 B2 | 1/2007 | Wachenschwanz et al. |
| 7,166,319 B2 | 1/2007 | Ishiyama |
| 7,166,374 B2 | 1/2007 | Suekane et al. |
| 7,169,487 B2 | 1/2007 | Kawai et al. |
| 7,174,775 B2 | 2/2007 | Ishiyama |
| 7,179,549 B2 | 2/2007 | Malhotra et al. |
| 7,184,139 B2 | 2/2007 | Treves et al. |
| 7,196,860 B2 | 3/2007 | Alex |
| 7,199,977 B2 | 4/2007 | Suzuki et al. |
| 7,208,236 B2 | 4/2007 | Morikawa et al. |
| 7,216,909 B2 * | 5/2007 | Regalbuto ......... H01L 21/67781 901/49 |
| 7,220,500 B1 | 5/2007 | Tomiyasu et al. |
| 7,229,266 B2 | 6/2007 | Harper |
| 7,239,970 B2 | 7/2007 | Treves et al. |
| 7,252,897 B2 | 8/2007 | Shimokawa et al. |
| 7,277,254 B2 | 10/2007 | Shimokawa et al. |
| 7,281,920 B2 | 10/2007 | Homola et al. |
| 7,292,329 B2 | 11/2007 | Treves et al. |
| 7,301,726 B1 | 11/2007 | Suzuki |
| 7,302,148 B2 | 11/2007 | Treves et al. |
| 7,305,119 B2 | 12/2007 | Treves et al. |
| 7,314,404 B2 | 1/2008 | Singh et al. |
| 7,320,584 B1 | 1/2008 | Harper et al. |
| 7,329,114 B2 | 2/2008 | Harper et al. |
| 7,375,362 B2 | 5/2008 | Treves et al. |
| 7,420,886 B2 | 9/2008 | Tomiyasu et al. |
| 7,425,719 B2 | 9/2008 | Treves et al. |
| 7,471,484 B2 | 12/2008 | Wachenschwanz et al. |
| 7,498,062 B2 | 3/2009 | Calcaterra et al. |
| 7,531,485 B2 | 5/2009 | Hara et al. |
| 7,537,846 B2 | 5/2009 | Ishiyama et al. |
| 7,549,209 B2 | 6/2009 | Wachenschwanz et al. |
| 7,569,490 B2 | 8/2009 | Staud |
| 7,597,792 B2 | 10/2009 | Homola et al. |
| 7,597,973 B2 | 10/2009 | Ishiyama |
| 7,608,193 B2 | 10/2009 | Wachenschwanz et al. |
| 7,632,087 B2 | 12/2009 | Homola |
| 7,656,615 B2 | 2/2010 | Wachenschwanz et al. |
| 7,682,546 B2 | 3/2010 | Harper |
| 7,684,152 B2 | 3/2010 | Suzuki et al. |
| 7,686,606 B2 | 3/2010 | Harper et al. |
| 7,686,991 B2 | 3/2010 | Harper |
| 7,695,833 B2 | 4/2010 | Ishiyama |
| 7,722,968 B2 | 5/2010 | Ishiyama |
| 7,733,605 B2 | 6/2010 | Suzuki et al. |
| 7,736,768 B2 | 6/2010 | Ishiyama |
| 7,755,861 B1 | 7/2010 | Li et al. |
| 7,758,732 B1 | 7/2010 | Calcaterra et al. |
| 7,833,639 B2 | 11/2010 | Sonobe et al. |
| 7,833,641 B2 | 11/2010 | Tomiyasu et al. |
| 7,910,159 B2 | 3/2011 | Jung |
| 7,911,736 B2 | 3/2011 | Bajorek |
| 7,924,519 B2 | 4/2011 | Lambert |
| 7,944,165 B1 | 5/2011 | O'Dell |
| 7,944,643 B1 | 5/2011 | Jiang et al. |
| 7,955,723 B2 | 6/2011 | Umezawa et al. |
| 7,983,003 B2 | 7/2011 | Sonobe et al. |
| 7,993,497 B2 | 8/2011 | Moroishi et al. |
| 7,993,765 B2 | 8/2011 | Kim et al. |
| 7,998,912 B2 | 8/2011 | Chen et al. |
| 8,002,901 B1 | 8/2011 | Chen et al. |
| 8,003,237 B2 | 8/2011 | Sonobe et al. |
| 8,012,920 B2 | 9/2011 | Shimokawa |
| 8,038,863 B2 | 10/2011 | Homola |
| 8,057,926 B2 | 11/2011 | Ayama et al. |
| 8,062,778 B2 | 11/2011 | Suzuki et al. |
| 8,064,156 B1 | 11/2011 | Suzuki et al. |
| 8,076,013 B2 | 12/2011 | Sonobe et al. |
| 8,092,931 B2 | 1/2012 | Ishiyama et al. |
| 8,100,685 B1 | 1/2012 | Harper et al. |
| 8,101,054 B2 | 1/2012 | Chen et al. |
| 8,125,723 B1 | 2/2012 | Nichols et al. |
| 8,125,724 B1 | 2/2012 | Nichols et al. |
| 8,137,517 B1 | 3/2012 | Bourez |
| 8,142,916 B2 | 3/2012 | Umezawa et al. |
| 8,163,093 B1 | 4/2012 | Chen et al. |
| 8,171,949 B1 | 5/2012 | Lund et al. |
| 8,173,282 B1 | 5/2012 | Sun et al. |
| 8,178,480 B2 | 5/2012 | Hamakubo et al. |
| 8,206,789 B2 | 6/2012 | Suzuki |
| 8,218,260 B2 | 7/2012 | Iamratanakul et al. |
| 8,247,095 B2 | 8/2012 | Champion et al. |

(56) References Cited

U.S. PATENT DOCUMENTS

| | | | |
|---|---|---|---|
| 8,257,783 B2 | 9/2012 | Suzuki et al. | |
| 8,298,609 B1 | 10/2012 | Liew et al. | |
| 8,298,689 B2 | 10/2012 | Sonobe et al. | |
| 8,309,239 B2 | 11/2012 | Umezawa et al. | |
| 8,316,668 B1 | 11/2012 | Chan et al. | |
| 8,331,056 B2 | 12/2012 | O'Dell | |
| 8,354,618 B1 | 1/2013 | Chen et al. | |
| 8,367,228 B2 | 2/2013 | Sonobe et al. | |
| 8,383,209 B2 | 2/2013 | Ayama | |
| 8,394,243 B1 | 3/2013 | Jung et al. | |
| 8,397,751 B1 | 3/2013 | Chan et al. | |
| 8,399,809 B1 | 3/2013 | Bourez | |
| 8,402,638 B1 | 3/2013 | Treves et al. | |
| 8,404,056 B1 | 3/2013 | Chen et al. | |
| 8,404,369 B2 | 3/2013 | Ruffini et al. | |
| 8,404,370 B2 | 3/2013 | Sato et al. | |
| 8,406,918 B2 | 3/2013 | Tan et al. | |
| 8,414,966 B2 | 4/2013 | Yasumori et al. | |
| 8,425,975 B2 | 4/2013 | Ishiyama | |
| 8,431,257 B2 | 4/2013 | Kim et al. | |
| 8,431,258 B2 | 4/2013 | Onoue et al. | |
| 8,453,315 B2 | 6/2013 | Kajiwara et al. | |
| 8,485,772 B1* | 7/2013 | Ismail | H01L 21/6773 414/938 |
| 8,488,276 B1 | 7/2013 | Jung et al. | |
| 8,491,800 B1 | 7/2013 | Dorsey | |
| 8,492,009 B1 | 7/2013 | Homola et al. | |
| 8,492,011 B2 | 7/2013 | Itoh et al. | |
| 8,496,466 B1 | 7/2013 | Treves et al. | |
| 8,517,364 B1 | 8/2013 | Crumley et al. | |
| 8,517,657 B2 | 8/2013 | Chen et al. | |
| 8,524,052 B1 | 9/2013 | Tan et al. | |
| 8,530,065 B1 | 9/2013 | Chernyshov et al. | |
| 8,546,000 B2 | 10/2013 | Umezawa | |
| 8,551,253 B2 | 10/2013 | Na'im et al. | |
| 8,551,627 B2 | 10/2013 | Shimada et al. | |
| 8,556,566 B1 | 10/2013 | Suzuki et al. | |
| 8,559,131 B2 | 10/2013 | Masuda et al. | |
| 8,562,748 B1 | 10/2013 | Chen et al. | |
| 8,565,050 B1 | 10/2013 | Bertero et al. | |
| 8,570,844 B1 | 10/2013 | Yuan et al. | |
| 8,580,410 B2 | 11/2013 | Onoue | |
| 8,584,687 B1 | 11/2013 | Chen et al. | |
| 8,591,709 B1 | 11/2013 | Lim et al. | |
| 8,592,061 B2 | 11/2013 | Onoue et al. | |
| 8,596,287 B1 | 12/2013 | Chen et al. | |
| 8,597,723 B1 | 12/2013 | Jung et al. | |
| 8,603,649 B2 | 12/2013 | Onoue | |
| 8,603,650 B2 | 12/2013 | Sonobe et al. | |
| 8,605,388 B2 | 12/2013 | Yasumori et al. | |
| 8,605,555 B1 | 12/2013 | Chernyshov et al. | |
| 8,608,147 B1 | 12/2013 | Yap et al. | |
| 8,609,263 B1 | 12/2013 | Chernyshov et al. | |
| 8,619,381 B2 | 12/2013 | Moser et al. | |
| 8,623,528 B2 | 1/2014 | Umezawa et al. | |
| 8,623,529 B2 | 1/2014 | Suzuki | |
| 8,634,155 B2 | 1/2014 | Yasumori et al. | |
| 8,658,003 B1 | 2/2014 | Bourez | |
| 8,658,292 B1 | 2/2014 | Mallary et al. | |
| 8,665,541 B2 | 3/2014 | Saito | |
| 8,668,953 B1 | 3/2014 | Buechel-Rimmel | |
| 8,674,327 B1 | 3/2014 | Poon et al. | |
| 8,685,214 B1 | 4/2014 | Moh et al. | |
| 8,696,404 B2 | 4/2014 | Sun et al. | |
| 8,711,499 B1 | 4/2014 | Desai et al. | |
| 8,743,666 B1 | 6/2014 | Bertero et al. | |
| 8,758,912 B2 | 6/2014 | Srinivasan et al. | |
| 8,787,124 B1 | 7/2014 | Chernyshov et al. | |
| 8,787,130 B1 | 7/2014 | Yuan et al. | |
| 8,791,391 B2 | 7/2014 | Bourez | |
| 8,795,765 B2 | 8/2014 | Koike et al. | |
| 8,795,790 B2 | 8/2014 | Sonobe et al. | |
| 8,795,857 B2 | 8/2014 | Ayama et al. | |
| 8,800,322 B1 | 8/2014 | Chan et al. | |
| 8,811,129 B1 | 8/2014 | Yuan et al. | |
| 8,817,410 B1 | 8/2014 | Moser et al. | |
| 2001/0022766 A1 | 9/2001 | Nakanishi et al. | |
| 2002/0060883 A1 | 5/2002 | Suzuki | |
| 2003/0022024 A1 | 1/2003 | Wachenschwanz | |
| 2004/0022387 A1 | 2/2004 | Weikle | |
| 2004/0132301 A1 | 7/2004 | Harper et al. | |
| 2004/0202793 A1 | 10/2004 | Harper et al. | |
| 2004/0202865 A1 | 10/2004 | Homola et al. | |
| 2004/0209123 A1 | 10/2004 | Bajorek et al. | |
| 2004/0209470 A1 | 10/2004 | Bajorek | |
| 2005/0036223 A1 | 2/2005 | Wachenschwanz et al. | |
| 2005/0142990 A1 | 6/2005 | Homola | |
| 2005/0150862 A1 | 7/2005 | Harper et al. | |
| 2005/0151282 A1 | 7/2005 | Harper et al. | |
| 2005/0151283 A1 | 7/2005 | Bajorek et al. | |
| 2005/0151300 A1 | 7/2005 | Harper et al. | |
| 2005/0155554 A1 | 7/2005 | Saito | |
| 2005/0167867 A1 | 8/2005 | Bajorek et al. | |
| 2005/0263401 A1 | 12/2005 | Olsen et al. | |
| 2006/0147758 A1 | 7/2006 | Jung et al. | |
| 2006/0181697 A1 | 8/2006 | Treves et al. | |
| 2006/0207890 A1 | 9/2006 | Staud | |
| 2007/0070549 A1 | 3/2007 | Suzuki et al. | |
| 2007/0177297 A1 | 8/2007 | Lai et al. | |
| 2007/0245909 A1 | 10/2007 | Homola | |
| 2008/0075845 A1 | 3/2008 | Sonobe et al. | |
| 2008/0093760 A1 | 4/2008 | Harper et al. | |
| 2009/0117408 A1 | 5/2009 | Umezawa et al. | |
| 2009/0136784 A1 | 5/2009 | Suzuki et al. | |
| 2009/0169922 A1 | 7/2009 | Ishiyama | |
| 2009/0191331 A1 | 7/2009 | Umezawa et al. | |
| 2009/0202866 A1 | 8/2009 | Kim et al. | |
| 2009/0274847 A1* | 11/2009 | Guo | B05C 3/09 427/430.1 |
| 2009/0311557 A1 | 12/2009 | Onoue et al. | |
| 2010/0143752 A1 | 6/2010 | Ishibashi et al. | |
| 2010/0190035 A1 | 7/2010 | Sonobe et al. | |
| 2010/0196619 A1 | 8/2010 | Ishiyama | |
| 2010/0196740 A1 | 8/2010 | Ayama et al. | |
| 2010/0209601 A1 | 8/2010 | Shimokawa et al. | |
| 2010/0215992 A1 | 8/2010 | Horikawa et al. | |
| 2010/0232065 A1 | 9/2010 | Suzuki et al. | |
| 2010/0247965 A1 | 9/2010 | Onoue | |
| 2010/0261039 A1 | 10/2010 | Itoh et al. | |
| 2010/0279151 A1 | 11/2010 | Sakamoto et al. | |
| 2010/0300884 A1 | 12/2010 | Homola et al. | |
| 2010/0304186 A1 | 12/2010 | Shimokawa | |
| 2011/0097603 A1 | 4/2011 | Onoue | |
| 2011/0097604 A1 | 4/2011 | Onoue | |
| 2011/0171495 A1 | 7/2011 | Tachibana et al. | |
| 2011/0206947 A1 | 8/2011 | Tachibana et al. | |
| 2011/0212346 A1 | 9/2011 | Onoue et al. | |
| 2011/0223446 A1 | 9/2011 | Onoue et al. | |
| 2011/0244119 A1 | 10/2011 | Umezawa et al. | |
| 2011/0299194 A1 | 12/2011 | Aniya et al. | |
| 2011/0311841 A1 | 12/2011 | Saito et al. | |
| 2012/0069466 A1 | 3/2012 | Okamoto et al. | |
| 2012/0070692 A1 | 3/2012 | Sato et al. | |
| 2012/0077060 A1 | 3/2012 | Ozawa | |
| 2012/0127599 A1 | 5/2012 | Shimokawa et al. | |
| 2012/0127601 A1 | 5/2012 | Suzuki et al. | |
| 2012/0129009 A1 | 5/2012 | Sato et al. | |
| 2012/0140359 A1 | 6/2012 | Tachibana | |
| 2012/0141833 A1 | 6/2012 | Umezawa et al. | |
| 2012/0141835 A1 | 6/2012 | Sakamoto | |
| 2012/0148875 A1 | 6/2012 | Hamakubo et al. | |
| 2012/0156523 A1 | 6/2012 | Seki et al. | |
| 2012/0164488 A1 | 6/2012 | Shin et al. | |
| 2012/0170152 A1 | 7/2012 | Sonobe et al. | |
| 2012/0171369 A1 | 7/2012 | Koike et al. | |
| 2012/0175243 A1 | 7/2012 | Fukuura et al. | |
| 2012/0189872 A1 | 7/2012 | Umezawa et al. | |
| 2012/0196049 A1 | 8/2012 | Azuma et al. | |
| 2012/0207919 A1 | 8/2012 | Sakamoto et al. | |
| 2012/0225217 A1 | 9/2012 | Itoh et al. | |
| 2012/0251842 A1 | 10/2012 | Yuan et al. | |
| 2012/0251846 A1 | 10/2012 | Desai et al. | |
| 2012/0276417 A1 | 11/2012 | Shimokawa et al. | |
| 2012/0308722 A1 | 12/2012 | Suzuki et al. | |

(56) References Cited

U.S. PATENT DOCUMENTS

| | | |
|---|---|---|
| 2013/0040167 A1 | 2/2013 | Alagarsamy et al. |
| 2013/0071694 A1 | 3/2013 | Srinivasan et al. |
| 2013/0165029 A1 | 6/2013 | Sun et al. |
| 2013/0175252 A1 | 7/2013 | Bourez |
| 2013/0216865 A1 | 8/2013 | Yasumori et al. |
| 2013/0230647 A1 | 9/2013 | Onoue et al. |
| 2013/0314815 A1 | 11/2013 | Yuan et al. |
| 2014/0011054 A1 | 1/2014 | Suzuki |
| 2014/0044992 A1 | 2/2014 | Onoue |
| 2014/0050843 A1 | 2/2014 | Yi et al. |
| 2014/0151360 A1 | 6/2014 | Gregory et al. |
| 2014/0234666 A1 | 8/2014 | Knigge et al. |

\* cited by examiner

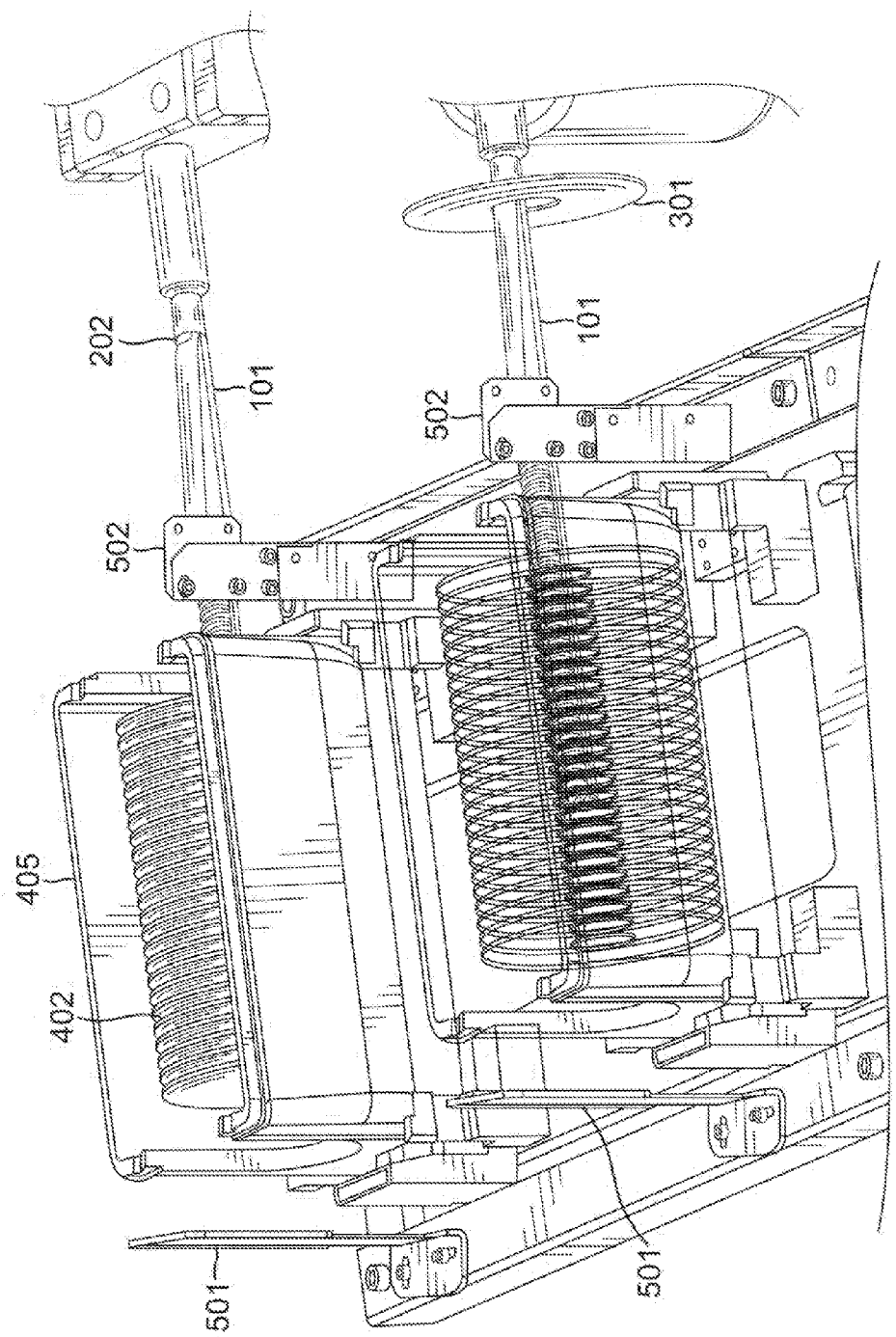

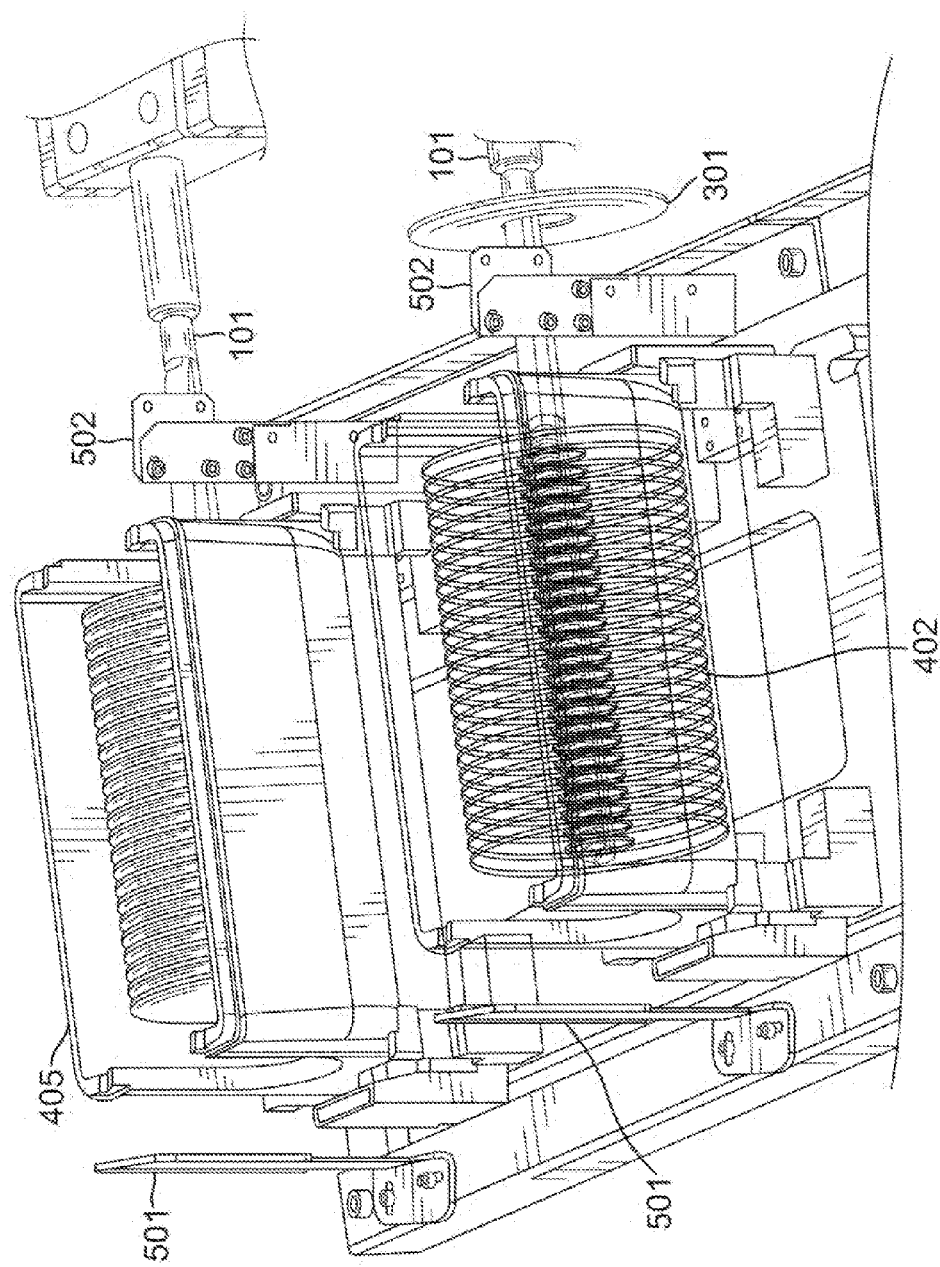

MANDREL FOR SUBSTRATE TRANSPORT SYSTEM WITH NOTCH

BACKGROUND

Substrate processing systems generally include several process stations that work together to deposit thin layers of material onto substrates. A transport system may be used to transport the substrates on carrier holders and for transferring to and from carrier cassettes through the process stations.

One example of substrate processing is the manufacture of magnetic disks for storage disk drives. A conventional disk substrate has a center hole for mounting on a hub within a storage drive. The center hole is also useful for capture and transfer of the disk substrate during various stages of the manufacturing process, which avoids disturbing the flat media surface as various layers are formed. One example of a transfer mechanism is to insert a mandrel, a rod-like structure, into the center holes of disk substrates being held in a cassette carrier. The mandrel may be used for extracting disk substrates from cassettes and transfer to other cassettes.

BRIEF DESCRIPTION OF THE DRAWINGS

Various aspects of the present invention will now be presented in the detailed description by way of example, and not by way of limitation, with reference to the accompanying drawings, wherein:

FIGS. 5A and 5B are diagrams illustrating a mandrel having an unseated disk while capturing a set of disks within full cassettes.

DETAILED DESCRIPTION

Figure 1:
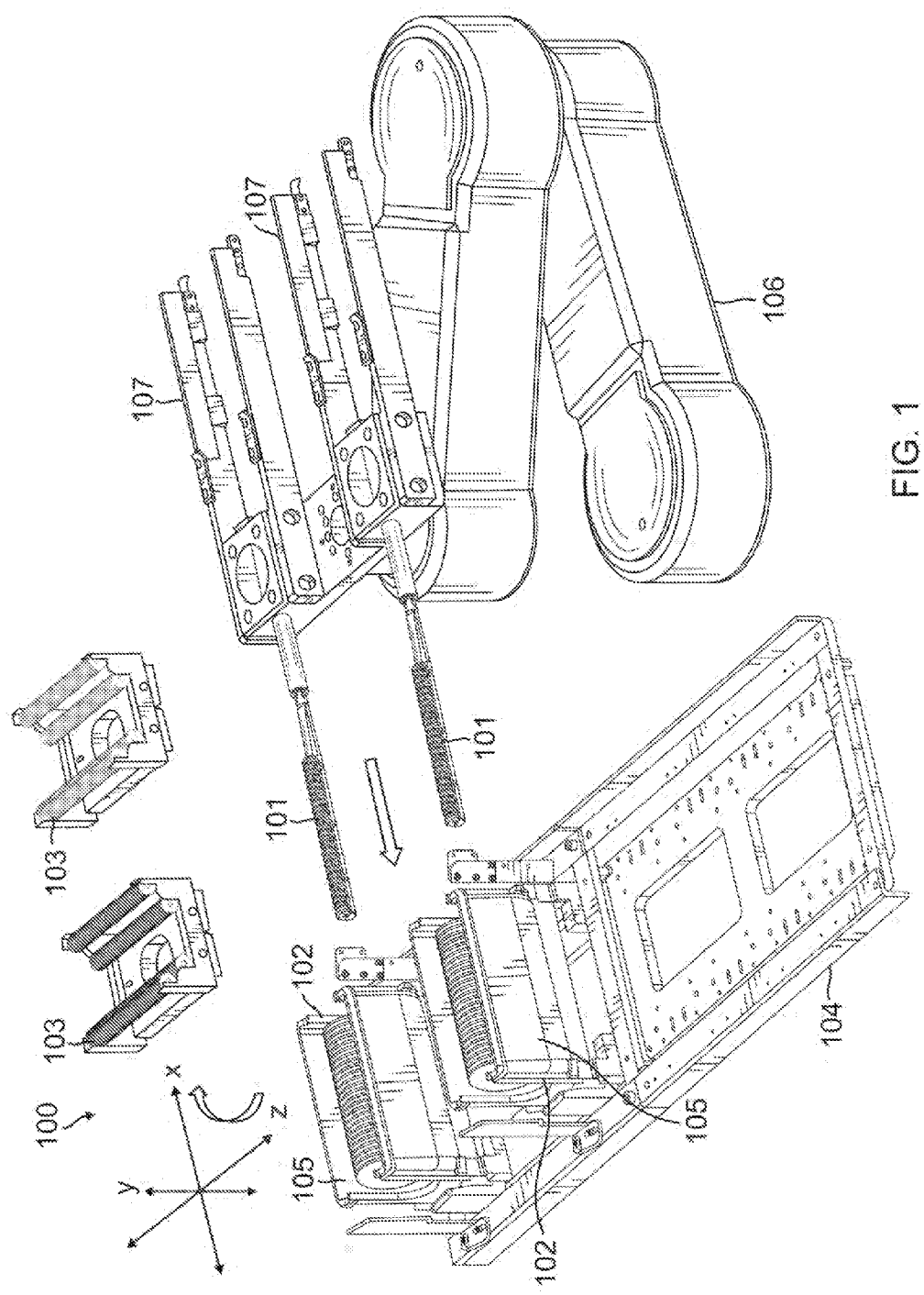
FIG. 1 is a diagram illustrating an exemplary embodiment of a substrate transporting system in position to capture a set of disks in full cassettes.

The detailed description set forth below in connection with the appended drawings is intended as a description of various exemplary embodiments and is not intended to represent the only embodiments that may be practiced. The detailed description includes specific details for the purpose of providing a thorough understanding of the embodiments. However, it will be apparent to those skilled in the art that the embodiments may be practiced without these specific details. In some instances, well-known structures and components are shown in block diagram form in order to avoid obscuring the concepts of the embodiments. Acronyms and other descriptive terminology may be used merely for convenience and clarity and are not intended to limit the scope of the embodiments.

The various exemplary embodiments illustrated in the drawings may not be drawn to scale. Rather, the dimensions of the various features may be expanded or reduced for clarity. In addition, some of the drawings may be simplified for clarity. Thus, the drawings may not depict all of the components of a given apparatus.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments include the described components, structure, features, functionality, processes, advantages, benefits, or modes of operation.

In the following detailed description, various aspects of the present invention will be presented in the context of a mandrel for a substrate processing system. While these inventive aspects may be well suited for this application, those skilled in the art will realize that these aspects may be extended to other processing systems to produce different articles. By way of example, various aspects of the present invention may be used in processing systems to manufacture semiconductors or any other suitable articles that transporting during fabrication. Accordingly, any reference to a mandrel in a substrate processing system is intended only to illustrate the various aspects of the present invention, with the understanding that such aspects may have a wide range of applications.

One aspect of a mandrel for a substrate processing system described in this disclosure includes a rod having a free end and a fixed end, the fixed end configured to be coupled to a transport mechanism, a series of spacer elements arranged on the rod to keep the set of storage substrates seated on the rod in respective fixed positions with a last spacer element nearest to the fixed end; and a notch arranged on the rod between the fixed end and the last spacer element configured to catch a substrate that becomes unseated from the last spacer element.

FIG. 1 shows an exemplary substrate transfer system 100 that includes mandrels 101 attached to a transport mechanism 106. A set of cassettes 105 slides along a conveyor track 104 into a position that allows each mandrel 101 to penetrate the holes of substrates 102 that are arranged in cassettes 105. The mandrels 101 are configured to be propelled or retracted in three dimensional motion along the x, y and z axes shown in FIG. 1, as controlled by the transport mechanism 106. Each mandrel 101 has a free end for insertion into the cassettes 105, and a fixed end attached to the transport mechanism 106. In one example of operation, the substrates 102 have center holes, and the mandrels 101 may penetrate the center holes of the substrates 102. The mandrels 101 may lift the complete set of substrates 102 out of the cassettes 105. The mandrels 101 may rotate the captured substrates 102 into a position above cassettes 103, shown here as an approximately 90 degree clockwise rotation on the x-z plane. The mandrels 101 may lower the substrates 102 into the cassettes 103, release the substrates 102, and withdraw from the cassettes 103. The full cassettes 103 may then be transported to another location by a separate process. The empty cassettes 105 may be transported onto tracks 107 for removal from track 104 to be refilled with a new set of substrates 102 by a separate process. A new set of cassettes 105 filled with substrates 102 may then arrive at the capture and transfer position via track 104 by a separate process, and the capture and transfer may repeated by the mandrels 101 according to the above description.

Figure 2:
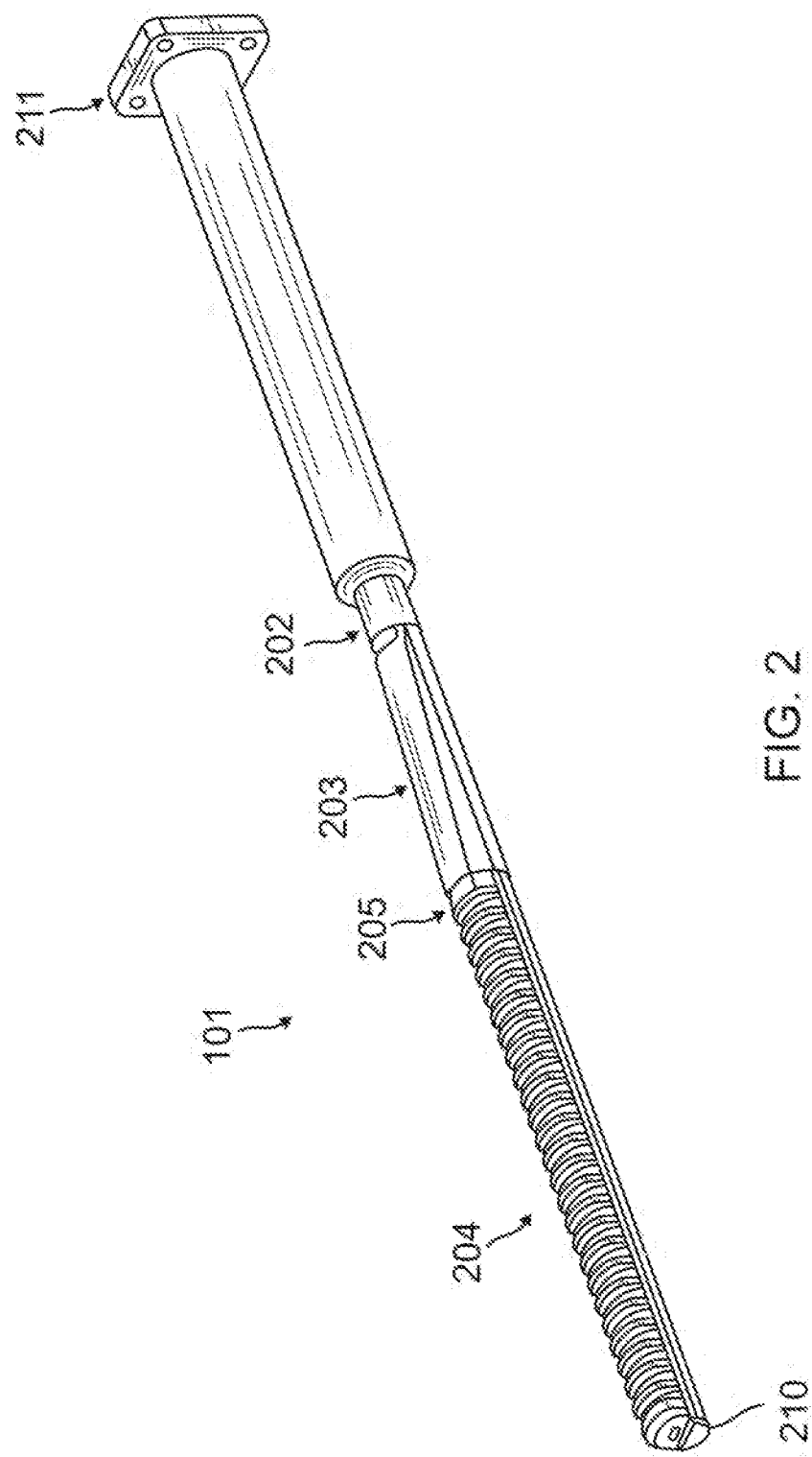
FIG. 2 is a diagram illustrating an exemplary embodiment of a mandrel having a notch.

FIG. 2 shows an exemplary mandrel 101 formed as a rod having a free end 210, a fixed end 211, a notch 202, a tapered surface 203, and series of spacer elements 204. The spacer elements 204 are arranged to provide slots. Within each slot, a single substrate 102 may sit in a suspended position. For example, each substrate may be supported by the mandrel 101 as the edge of the center hole in the substrate rests in a respective slot between spacer elements 204. The spacer elements 204 may be arranged such that the slots may align with the substrates 102 when the mandrel 101 is fully inserted into the cassette 105. The spacer elements 204 may also be arranged such that the substrates 102 may be kept spaced apart in respective fixed positions during capture and transfer by the mandrel 101. A spacer element 205 is the last, rearmost spacer element, which may be arranged to hold a substrate 102 captured from the end of the cassette 105. The spacer elements 204 may be arranged to span the mandrel 101 for a length approximately equal to the length of the cassette 105 to accommodate a full cassette of substrates 102. The number of spacer elements 204 may correspond to the number of substrates in a full cassette 105. The notch 202 is arranged at a distance from the last spacer element 205, the placement of which will be explained in further detail below.

Figure 3:
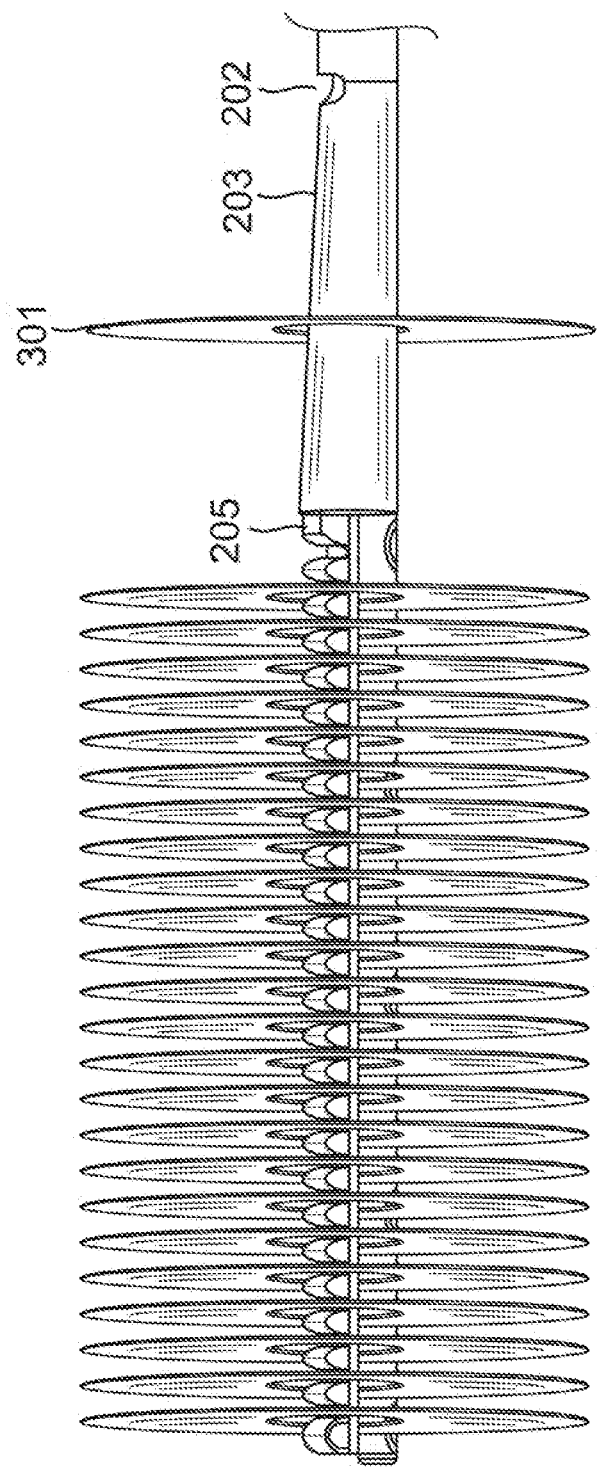
FIG. 3 is a diagram illustrating an exemplary embodiment of a mandrel as an unseated substrate slides into a notch.

FIG. 3 shows an exemplary configuration of the mandrel 101 for an unseated substrate 301. In this example, the substrate 301 positioned in a rearmost slot at the last spacer element 205 has become unseated from the slot. This misplacement may occur during movement of the mandrel 101, for example. The tapered surface 203 is arranged to promote movement of the unseated substrate 102 away from the spacer element 205 and toward the notch 202, where the unseated substrate 301 may rest.

Figure 4:
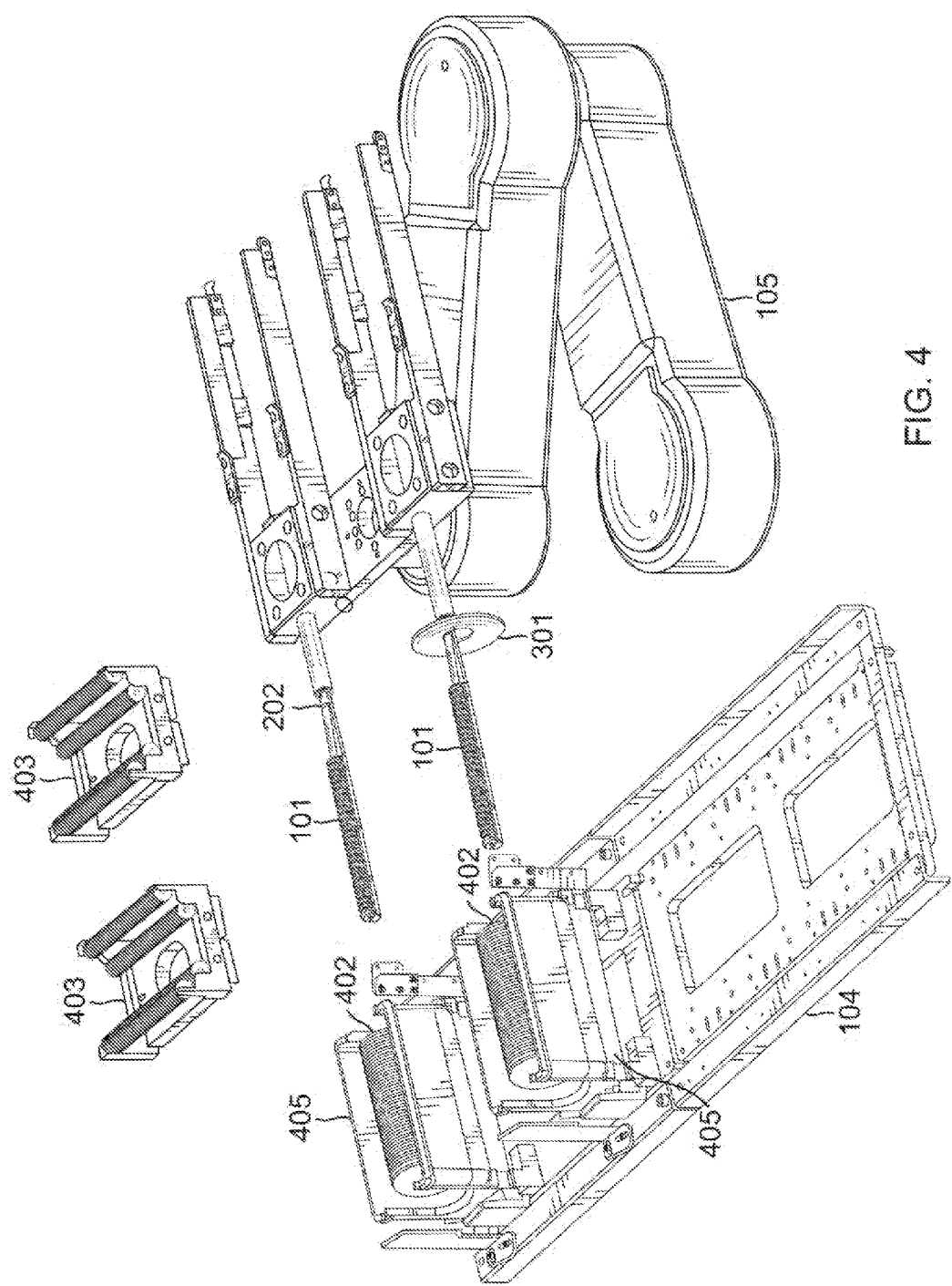
FIG. 4 is a diagram illustrating an exemplary embodiment of a mandrel holding an unseated substrate as the transporting system is ready to capture a subsequent set of substrates within full cassettes.

FIGS. 4, 5A and 5B show an exemplary configuration of a substrate transport system 400, in which the unseated substrate 301 rests in the notch 202. In this example, the mandrels 101 have completed a prior substrate transfer as shown in FIG. 1, during which the unseated substrate 301 has been caught in the notch 202 as shown in FIG. 3. Turning to FIG. 4, a subsequent set of substrate cassettes 405 have been parked in position at the capture station along the tray 104, ready for capture and transfer of substrates 402 by the mandrels 101 over to the empty cassettes 403.

FIG. 5A shows a detailed view of the mandrels 101 as they begin insertion into the set of substrates 402. A system of substrate sensors 502 and reflectors 501 is shown arranged on the tray structure 104, near the perimeter of the cassette 405. The sensors 502 and reflectors 501 may be arranged at a position that coincides with an expected placement of cassette 405 during capture and transfer of the substrates 402. Each sensor 502 may be configured to sense a light signal reflected by a respective reflector 501, for monitoring the associated cassette 405 in order to provide feedback to the transport mechanism during placement of the mandrels 101. For example, the feedback may include any one or more of the following: whether the cassette 405 is empty or full, whether the cassette 405 has arrived in the designated position, or where the centered position of the substrate 102 holes are located in order to assist alignment of the mandrels 101 during insertion. The feedback may be also used for parking the cassette 405 into position when arriving at the capture station on track 104. The feedback may also include mandrel position along the x axis.

Returning to FIG. 5A, substrate 301 is shown having a clearance distance with respect to the cassette 405, based on the arrangement of the notch 202 on the mandrel 101, as the mandrel 101 is inserted into the cassette 405. As shown in FIG. 5B, with the mandrels 101 fully inserted into the cassette 405 within holes of substrates 102, the substrate 301 resting in notch 202 is at a position with some clearance distance from the cassette 405. As such, the unseated 301 does not interfere with operation of the sensor 502 and reflector 501, allowing the mandrel 101 to be correctly guided into the cassette 405, and avoiding damage to the mandrel 101.

While the above process has been described with respect to the mandrels 101 penetrating the holes of substrates 102, 402, one skilled in the art recognizes that variations of substrate capture and transfer may include supporting alternative edges of a substrate and alternative positions of the substrate. The process as described may be applicable to disk substrates, but may also be applicable to substrates of various shapes and sizes. Furthermore, while the mandrel 101, 401 has been described herein as supporting a center hole edge of the substrates, variations of the mandrel 101, 401 may be implemented in accordance with the described embodiments to interact with any edge of a substrate.

Figure 6:
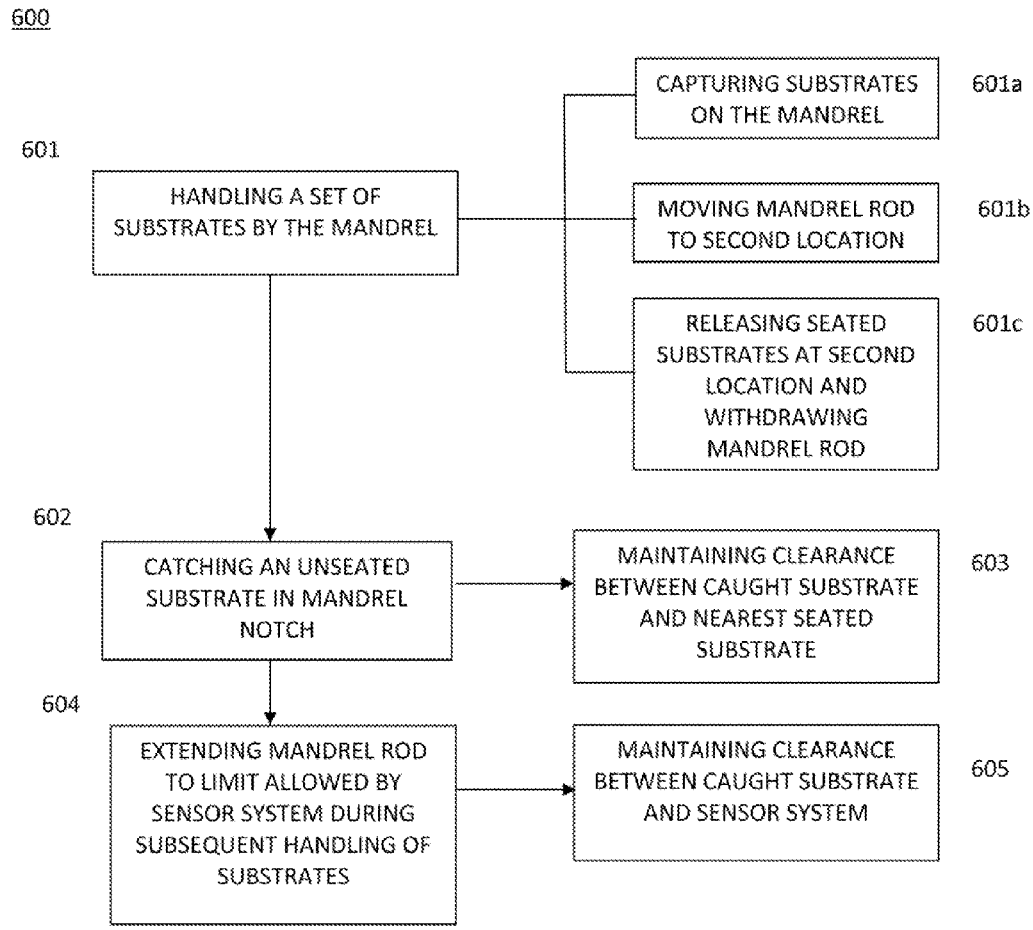
FIG. 6 is a flowchart of an exemplary method for transporting substrates using the mandrel shown in FIGS. 1-5B.

FIG. 6 is a flowchart of an exemplary method 600 for transporting substrates using the mandrel 101. In 601, the mandrel 101 may handle the set of substrates 102, each of which may be seated in a respective spacer element 204. During the handling, one or more substrates 102 may become unseated from the spacer elements 204. For example, a first substrate 301 may become loose from spacer element 205, and the next substrate at the rear of the set may subsequently become unseated from its respective spacer element. In 602, any unseated substrate may be caught by the notch 202.

The handling of the substrates 102 by the mandrel 101 may include capturing substrates 102 on the mandrel (601a), moving the mandrel 101 with captured substrates 102 to a second location (601b), or releasing seated substrates 102 at the second location and withdrawing the mandrel 101 (601c). The capturing of substrates 601a may include inserting a free end 201 of the mandrel 101 through a hole in each substrate of a set of substrates and lifting the mandrel 101 to capture the set of substrates 102. During any of these examples of substrate handling, a substrate 102 may become unseated and may be caught at 602 in the mandrel notch 202.

At 603, a clearance is maintained between the caught substrate 301 and the nearest seated substrate 102 based on the placement of the notch 202. At 604, during a subsequent capture or release of substrates 102, 402, the mandrel 101 may be extended to its full limit (e.g., within a full cassette for capture or an empty cassette for release). For example, a sensor system arranged around the set of substrates 102, 402 or around an empty cassette 103, 403 may be configured to define the limit of extension for the mandrel 101 motion during capture or release of substrates 102, 402. At 605, as the mandrel reaches the limit of extension, a clearance is maintained between the caught substrate 301 and the sensor system 501, 502 to prevent any interference by the caught substrate 301.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f) unless the element is expressly recited using the phrase "means for" or, in the case of a method claim, the element is recited using the phrase "step for."

What is claimed is:

1. A mandrel for transporting a set of substrates, comprising:

a rod having a free end and a fixed end, the fixed end configured to be coupled to a transport mechanism;

a series of spacer elements arranged on the rod to keep the set of substrates seated on the rod in respective fixed positions with a last spacer element nearest to the fixed end; and a notch arranged on the rod between the fixed end and the last spacer element configured to catch a substrate that becomes unseated from the last spacer element, wherein a linear surface of the rod on which the substrates are seated is tapered linearly inward toward the notch from a point near the last spacer element allowing the unseated substrate to slide into the notch.

2. The mandrel of claim 1, wherein the mandrel is configured with the notch at a distance from the last spacer element to maintain a clearance between a caught substrate and the nearest seated substrate.

3. The mandrel of claim 1,
wherein the set of substrates is held within a cassette and each of the substrates has a hole, and
wherein the free end of the rod is configured to penetrate the set of substrates through each hole.

4. The mandrel of claim 3, wherein the spacer elements are arranged to span a length of the rod approximately equal to the length of the cassette.

5. The mandrel of claim 3, wherein the mandrel is configured with the notch at a distance from the last spacer element to maintain a clearance between a caught substrate and the cassette when the mandrel is fully inserted into the cassette.

6. The mandrel of claim 1, wherein each of the substrates has a hole, wherein the free end of the rod is configured to penetrate the set of substrates for capturing the set of substrates together at a first location with an edge of the hole in each substrate seated between a respective pair of spacer elements, and to withdraw from the set of substrates when releasing the set of substrates together at a second location.

7. The mandrel of claim 1, wherein the rod is configured to be propelled or retracted by the transport mechanism in three dimensional motion.

8. A system for transporting a set of substrates, comprising:
a mandrel comprising:
a rod having a free end and a fixed end,
a series of spacer elements arranged on the rod to keep the set of substrates seated on the rod in respective fixed positions with a last spacer element nearest to the fixed end; and
a notch arranged on the rod between the fixed end and the last spacer element configured to catch a substrate that becomes unseated from the last spacer element; and
a transport mechanism having a first member coupled to the fixed end of the rod, and configured to propel or retract the rod in three dimensional motion, wherein a linear surface of the rod on which the substrates are seated is tapered linearly inward toward the notch from a point near the last spacer element allowing the unseated substrate to slide into the notch.

9. The system of claim 8,
wherein the free end of the rod is configured to penetrate through a hole in each substrate of the set of substrates, and
wherein the mandrel is configured with the notch at a distance from the last spacer element to maintain a clearance between a caught substrate and a sensor system when the mandrel is fully inserted into the set of substrates.

10. The system of claim 8, further comprising:
a sensor system arranged around the set of substrates, wherein the transport mechanism is configured to propel or retract the rod in response to feedback from the sensor system.

11. A method for transporting substrates by a transport system comprising a mandrel having a rod, a series of spacer elements and a notch arranged on the rod, the method comprising:
handling the substrates by the mandrel, wherein each substrate is seated within the series of spacer elements at a fixed position on the rod; and
catching a substrate in the notch, wherein the caught substrate is a formerly last substrate seated in the series of spacer elements nearest to the notch, wherein a linear surface of the rod on which the substrates are seated is tapered linearly inward toward the notch from a point near the last spacer element allowing the unseated substrate to slide into the notch.

12. The method of claim 11, wherein the transport system includes a sensor system arranged around the substrates configured to send feedback for motion control of the mandrel, the method further comprising:
extending the rod to a limit allowed by the sensor system during a subsequent handling of substrates; and
maintaining a clearance between the caught substrate and the sensor system when the rod is extended to the limit.

13. The method of claim 11, wherein the handling comprises capturing the substrates, comprising:
inserting a free end of the rod through a hole in each substrate of a set of substrates; and
lifting the rod to capture the set of substrates within the series of spacer elements.

14. The method of claim 11, wherein the handling comprises:
moving the rod with the seated substrates and the caught substrate from a first location to a second location.

15. The method of claim 14, wherein the handling further comprises:
releasing the seated substrates at the second location and withdrawing the rod from the substrates.

16. The method of claim 11, further comprising maintaining a clearance between the caught substrate and the nearest seated substrate.

* * * * *